(12) United States Patent
Jun et al.

(10) Patent No.: US 7,566,494 B2
(45) Date of Patent: Jul. 28, 2009

(54) INSULATED CONDUCTIVE PARTICLES AND ANISOTROPIC CONDUCTIVE ADHESIVE FILM USING THE SAME

(75) Inventors: Jung Bae Jun, Gyeonggi-do (KR); Jin Gyu Park, Seoul (KR); Jae Ho Lee, Gyeonggi-Do (KR)

(73) Assignee: Cheil Industries, Inc. (KR)

( * ) Notice: Subject to any disclaimer, the term of this patent is extended or adjusted under 35 U.S.C. 154(b) by 197 days.

(21) Appl. No.: 11/325,813

(22) Filed: Jan. 5, 2006

(65) Prior Publication Data

US 2007/0054984 A1 Mar. 8, 2007

(30) Foreign Application Priority Data

Sep. 2, 2005 (KR) .................. 10-2005-0081789

(51) Int. Cl.
*B32B 5/66* (2006.01)
(52) U.S. Cl. ................ 428/323; 428/328; 428/402; 428/403; 428/404; 428/405; 428/406; 428/407
(58) Field of Classification Search ......... 428/402–407, 428/323, 328
See application file for complete search history.

(56) References Cited

FOREIGN PATENT DOCUMENTS

| JP | 58-223953 | 12/1983 |
| JP | 62-176139 | 8/1987 |
| JP | 63-237372 | 3/1988 |
| JP | 2-204917 | 8/1990 |
| JP | 3-46774 | 2/1991 |
| JP | 3-112011 | 5/1991 |
| JP | 4-174980 | 6/1992 |
| JP | 4-259766 | 9/1992 |
| JP | 62-40183 | 8/1994 |
| JP | 6-333965 | 12/1994 |
| JP | 6-349339 | 12/1994 |
| JP | 7-105716 | 4/1995 |
| JP | 2001-164232 | 6/2001 |
| JP | 2001-195921 | 7/2001 |
| JP | 2003-313459 | 11/2003 |
| WO | 2005/109448 | * 5/2005 |

* cited by examiner

*Primary Examiner*—Leszek Kiliman
(74) *Attorney, Agent, or Firm*—Myers Bigel Sibley & Sajovec, PA

(57) ABSTRACT

Insulated conductive particles, anisotropic adhesive films, and electrical connections using the same are provided.

In some embodiments of the present invention, an insulated conductive particle includes a conductive particle with insulating microparticles bound thereto, wherein the insulating microparticles include a hard particle region and a soft functional resin region, and wherein the soft functional resin region includes a functional group capable of binding a metal.

37 Claims, 5 Drawing Sheets

INSULATED CONDUCTIVE PARTICLES AND ANISOTROPIC CONDUCTIVE ADHESIVE FILM USING THE SAME

CROSS-REFERENCE TO RELATED APPLICATION

This application claims priority under 35 U.S.C. § 119 from Korean Patent Application No. 10-2005-0081789, filed on Sep. 2, 2005, in the Korean Intellectual Property Office, the disclosure of which is incorporated by reference herein as if set forth in its entirety.

FIELD OF THE INVENTION

The present invention relates to insulated conductive particles and anisotropic adhesive films using the same. More specifically, the present invention relates to insulated conductive particles and anisotropic adhesive films that may be useful in liquid crystal display (LCD) substrates.

BACKGROUND OF THE INVENTION

In general, an anisotropic conductive connection is necessary to electrically connect connection electrodes of an integrated circuit (IC) board to terminals of a substrate, such as a liquid crystal display (LCD) panel, mounted on a circuit board. Anisotropic conductive packaging materials include the widely-used film-type adhesives, in which conductive particles, such as metal or resin-coated resin particles, are dispersed in an insulating resin, e.g., epoxy, urethane, or acrylic resin. Conductive particles may be interposed between electrodes and terminals by dispersing an anisotropic conductive packaging material containing the conductive particles between the electrodes and the terminals, followed by thermal pressing to adhere the packaging material therebetween. At this time, it is desirable for an electrical connection to occur in the z-axis direction, while an insulating state is maintained in the xy-plane due to the presence of the insulating components in the insulating adhesive. Thus, anisotropic conductivity may be exhibited.

In circuit board packaging requiring anisotropic conductive connections, recent advances in circuit and LCD technologies have brought about a decrease in the size of connection pitches and IC bumps and an increase in the number of leads printed on substrates. Further, there has been a continued need for improved connection reliability. In order to satisfy such technical needs, the conductive particles present in anisotropic conductive films may need to have a small particle diameter. Further, extensive research and development has been continuously conducted to increase the concentration of conductive particles in anisotropic conductive films, in order to improve connection reliability. However, as the diameter of the conductive particles decreases and the density of the particles in the film increases, aggregation of the particles and formation of the bridges between particles may occur, which may create a non-uniform connection and cause frequent shorting between patterns.

Various methods have been proposed to solve the problem of shorting between adjacent electrodes. For example, methods include partially or fully covering the surface of conductive particles with insulating coating materials (e.g., insulating polymer resins) by microencapsulation, spray drying, coacervation, electrostatic coalescence, metathesis polymerization, physical/mechanical hybridization and other processes. See Japanese Patent Laid-Open Nos. Sho 62-40183, Sho 62-176139, Sho 63-237372, Hei 3-46774, Hei 4-174980, Hei 7-105716, 2001-195921 and 2003-313459. Another method described in Japanese Patent Laid-Open No. Hei 2-204917 includes coating the surface of conductive particles with an electrically insulating metal oxide.

Japanese Patent Laid-Open No. Sho 62-40183 describes an anisotropic conductive adhesive film that includes conductive particles that are surface-coated with an insulating resin and then thermally pressed. When the insulating layer is ruptured to expose the conductive layer of the conductive particles, electrical connectivity may be achieved. Japanese Patent Laid-Open No. Sho 63-237372 describes an insulating layer for conductive particles that softens and flows when thermally pressed, which as a result, may allow a portion of the conductive particle to be exposed and electrical connection may be achieved. For both of these methods, however, when the insulating layer is ruptured or softened, respectively, the insulating layer may not be completely removed. Thus, the conductive surface may not be exposed sufficiently to lower the connection resistance. As a result, a stable connection between electrodes may be difficult to achieve, making it difficult to ensure a reliable electrical connection for a sustained period of time. Moreover, the rupturing of the thermosetting layer may cause damage to minute bumps or patterns in the film. In addition, new low-temperature fast curing types of anisotropic conductive films, which have been introduced in order to shorten processing time and reduce the production costs, make it more difficult to rupture or remove the insulating layer, thus further deteriorating connection reliability.

Japanese Patent Laid-Open No. Sho 58-223953, Hei 6-333965, Hei 6-349339 and 2001-164232 describe methods of minimizing the aggregation of particles and improving connection reliability of anisotropic conductive adhesives by further adding insulating organic or inorganic particles, insulating fibrous fillers and the like, in addition to the conductive particles. However, these methods limit the concentration of conductive particles that may be used in the films, and may create further problems, including difficulty in sustaining long-term connection reliability.

Japanese Patent Laid-Open Nos. Hei 3-112-11 and Hei 4-259766 describe methods for producing insulated conductive particles by attaching insulating particles to the surface of the conductive particles. These methods use an additional binder or insulating resin to attach the insulating particles to the surface of the conductive particles. Since the insulating particles are simply bound to the resin physically, the binding force between the insulating particles and the resin is weak. For this reason, when the insulated conductive particles are dispersed into an anisotropic conductive adhesive resin, the insulating particles may aggregate due to added solvents and stirring, and thus, the insulation of the conductive particles may not be sufficient. In addition, despite the separation of the insulating particles under connection conditions (e.g., heating and pressurization), the resin used to attach the insulating particles may not be completely removed, thus deteriorating electrical connectivity and connection reliability.

Various methods have been attempted to prevent the separation of conductive particles from the electrodes by forming anisotropic conductive films in multilayer structures. However, these methods may require extended production time and complicated production procedures, which are undesirable from a processing standpoint. These methods are therefore generally less desirable than methods using insulated conductive particles.

It would therefore be desirable to provide insulated conductive particles with superior electrical connectivity in the pressurizing direction and with high connection reliability. It would further be desirable to provide insulated conductive particles that can eliminate or reduce shorting between adjacent bumps or interconnection patterns by preventing aggregation of conductive particles. It would further be desirable to provide insulated conductive particles having superior solvent resistance in adhesive resin compositions. It would further be desirable to provide insulated conductive particles that may be used in compact interconnection pattern pitches and low-temperature fast-curing anisotropic adhesive films.

SUMMARY OF THE INVENTION

In some embodiments of the present invention, an insulated conductive particle includes a conductive particle with insulating microparticles bound thereto, wherein the insulating microparticles include a hard particle region and a soft functional resin region, and wherein the soft functional resin region includes a functional group capable of binding a metal.

In some embodiments of the present invention, the conductive particle may be produced by forming at least one conductive metal layer on the surface of a polymer particle.

In some embodiments of the present invention, the hard particle region may be composed of an inorganic particle, including a silica particle, a titanium dioxide particle and a metal oxide particle; a highly crosslinked organic polymer particle; or an organic/inorganic hybrid particle.

In other embodiments of the present invention, the hard particle region includes a highly crosslinked organic polymer particle that includes: a) a homopolymer or copolymer consisting or consisting essentially of one or more crosslinking monomer(s); or b) a copolymer prepared from at least one crosslinking monomer and at least one non-crosslinking monomer.

In some embodiments of the present invention, the soft functional resin region is composed of a linear or low-crosslinked organic polymer resin containing a functional group capable of binding to a metal. In some embodiments, a functional monomer may be included in the soft functional resin region of an insulating microparticle.

In some embodiments of the present invention, binding of the insulating microparticles to the conductive particles may be performed by physical/mechanical hybridization. In some embodiments, physical/mechanical hybridization includes pressurization, friction and/or high-speed rotation.

In some embodiments of the present invention, an anisotropic adhesive film includes insulated conductive particles according an embodiment of the invention dispersed therein.

In some embodiments of the present invention, an electrical connection structure includes an anisotropic adhesive film according to an embodiment of the invention and a pair of substrates facing each other, wherein the anisotropic adhesive film is interposed between the two substrates.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
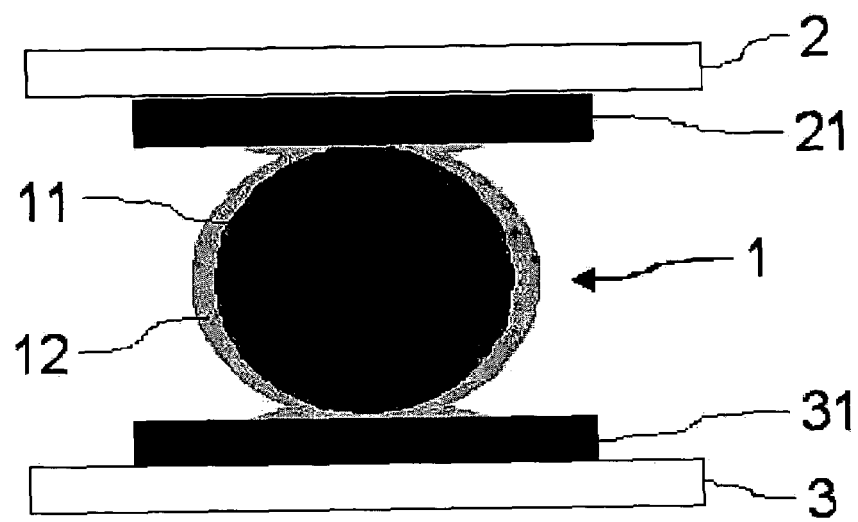
FIG. 1 shows a cross-sectional view of an electrical connection that uses a conventional anisotropic conductive adhesive film including coated insulated conductive particles.

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some embodiments of the present invention, an insulated conductive particle includes a conductive particle with insulating microparticles bound thereto, wherein the insulating microparticles include a hard particle region and a soft functional resin region, and wherein the soft functional resin region includes a functional group capable of binding a metal.

The term "conductive particle" refers to a particle that may conduct electricity. In some embodiments of the present invention, a conductive particle may be produced by forming at least one conductive metal layer on the surface of a polymer particle. Examples of metals that may be used to form the metal layer include, but are not limited to, nickel (Ni), gold (Au), silver (Ag), copper (Cu), platinum (Pt), palladium (Pd), cobalt (Co), tin (Sn), indium (In), indium tin oxide (ITO) and multilayer composite metals containing one or more of these metals as main components. In some embodiments of the present invention, the conductive metal layer is a double metal layer. For example, the double metal layer may include nickel and gold, wherein the surface of the polymer particle is sequentially plated with nickel and gold. In another embodiment, another conductive metal, such as platinum (Pt) or silver (Ag), may be used instead of gold.

In some embodiments of the present invention, the conductive particle has an average diameter in a range of about 1 to about 20 μm. Further, in some embodiments, the conductive particle has an aspect ratio of less than about 1.5, and in some embodiments, less than about 1.3. The term "aspect ratio," as used herein, refers to the ratio of the diameter of the longest axis to the diameter of the shortest axis of a single particle. In addition, in some embodiments, the conductive particle has a coefficient of variation (CV) in particle diameter of 20% or less, and in some embodiments, a CV value not greater than 10%. The term "CV value" refers to the percentage obtained by dividing the standard deviation of the particle diameter by the average particle diameter.

In some embodiments, the conductive metal layer of the conductive particles may have a thickness in a range of about 0.01 μm to about 1 μm. When the metal layer has a thickness of less than 0.01 μm, the desired conductivity may not be attained. However, when the metal layer has a thickness exceeding 1 μm, the particles may aggregate when used as materials for electrode connections, making it difficult to attain desirable conductivity performance.

The term "insulating microparticle" refers to a particle that may be attached to a conductive particle to electrically insulate the particle and prevent an electrical connection when present between the conductive particle and another conducting element. The insulating microparticle includes a hard particle region and a soft functional resin region, wherein the soft functional resin region includes a functional group capable of binding a metal. In some embodiments, the insulating microparticles have a core-shell structure, wherein the hard particle region is present as the core and the soft functional resin is present as the shell. The insulating microparticles may also have other morphologies, including a raspberry morphology or a hemispheric morphology. The hard particle region may allow for the insulating microparticle to retain a spherical, or other desirable morphological shape, after the insulating microparticles are bound to the conductive particle.

The "hard particle region" refers to a region of the particle that is not deformed by an external force, impact and friction force during physical/mechanical hybridization and does not dissolve in insulating resin adhesives and other solvents. The hard particle region may be composed of an inorganic particle, including a silica particle, a titanium dioxide particle and a metal oxide particle; a highly crosslinked organic polymer particle; or an organic/inorganic hybrid particle.

In some embodiments of the present invention, the hard particle region includes a highly crosslinked organic polymer particle that includes: a) a homopolymer or copolymer consisting or consisting essentially of one or more crosslinking monomer(s); or b) a copolymer prepared from at least one crosslinking monomer and at least one non-crosslinking monomer. In order to obtain the desired rigidity of the hard particle region, the content of the crosslinking monomer is preferably about 30% by weight or more, based on the total weight of the monomers.

The crosslinking monomer is a monomer with two or more reactive sites that may act to covalently link two or more polymer chains (or link two or more sites of one polymer chain). In some embodiments, the crosslinking monomer may be polymerized by radical polymerization. Exemplary crosslinking monomers include polyacrylate-based crosslinking compounds, including (poly)ethylene glycol di(meth)acrylate, (poly)propylene glycol di(meth)acrylate, pentaerythritol tetra(meth)acrylate, pentaerythritol tri(meth)acrylate, pentaerythritol di(meth)acrylate, trimethylolpropane tri(meth)acrylate, dipentaerythritol hexa(meth)acrylate, dipentaerythritol penta(meth)acrylate, glycerol tri(meth)acrylate and the like; and polyvinyl and polyallyl compounds, including divinylbenzene, 1,4-divinyloxybutane, divinylsulfone, diallyl phthalate, diallylacrylamide, triallyl (iso)cyanurate, triallyl trimellitate and the like. Two or more crosslinking monomers may also be used in any combination.

The non-crosslinking monomer is a monomer that does not act as a crosslinking monomer, as defined herein. In some embodiments, the non-crosslinking monomer may be polymerized by radical polymerization. Exemplary non-crosslinking monomers include monoacrylate-based monomers, e.g., methyl(meth)acrylate, ethyl(meth)acrylate, propyl (meth)acrylate, n-butyl(meth)acrylate, isobutyl (meth)acrylate, t-butyl(meth)acrylate, 2-ethylhexyl(meth) acrylate, n-octyl(meth)acrylate, lauryl(meth)acrylate, stearyl (meth)acrylate and the like; and vinyl monomers, such as styrene-based monomers, e.g., styrene, α-methyl styrene, m-chloromethyl styrene, and ethyl vinyl benzene, vinyl chloride, vinyl acetate, vinyl ether, vinyl propionate, vinyl butyrate and the like. Two or more non-crosslinking monomers may also be used in any combination.

The "soft functional resin region" refers to a region of the microparticle that is formed of a soft resin containing a functional group capable of binding a metal. The term "soft" refers to the state wherein the resin is insoluble in insulating adhesives and other solvents but is easily deformed by an external physical/mechanical force. The soft functional resin region is preferably composed of a linear or low-crosslinked organic polymer resin containing a functional group capable of binding to a metal. The addition of a small amount of crosslinking monomer may enable the final copolymer to remain insoluble in adhesives and solvents, while also retaining flexibility. Thus, if a crosslinking monomer is present, it is preferably present in an amount in a range of about 0.5 to about 15% by weight, based on the total weight of the monomers. In general, suitable functional groups present in the soft functional resin region include nucleophilic groups. Exemplary functional groups present in the soft functional resin region include carboxyl, hydroxyl, glycol, aldehyde, oxazoline, silane, silanol, amine, ammonium, amide, imide, nitro, nitrile, pyrrolidone, thiol, sulfonic acid, sulfonium, sulfide, isocyanate groups and the like.

In some embodiments, a functional monomer may be included in the soft functional resin region of an insulating microparticle. The functional monomer provides a functional group capable of binding with a metal, and may allow the soft functional resin region to form a chemical bond with the metal of the conductive particle, thus binding the insulating microparticle to the conductive particle. Thus, in some embodiments, the soft functional resin region is composed of a copolymer prepared from at least one non-crosslinking monomer, as defined herein, and a functional monomer having a functional group capable of binding a metal, as described above. In some embodiments, the copolymer is further copolymerized with a crosslinking monomer, as defined above, in an amount of in a range of about 0.5 to about 15% by weight, based on the total weight of the monomers. In some embodiments, the functional monomer is present in the copolymer in an amount of about 1% by weight or more, based on the total weight of the monomers. However, in some embodiments, no functional monomer is present, and the functional group capable of binding a metal may be introduced through a chemical substitution or reaction on the surface after formation of the soft functional polymer resin.

In some embodiments, the functional monomer may be polymerized by radical polymerization. Exemplary functional monomers include unsaturated carboxylic acids, including (meth)acrylic acid, maleic acid, and itaconic acid; and 2-hydoxyethyl(meth)acrylate, hydroxypropyl(meth) acrylate, hydroxybutyl (meth)acrylate, polyethylene glycol (meth)acrylate, methoxypolyethylene glycol (meth)acrylate, glycidyl(meth)acrylate, dimethylaminoethyl(meth)acrylate, allyl glycidyl ether, 2-isopropenyl-2-oxazoline, diethylaminoethyl(meth)acrylate, alkyl (meth)acrylamide, 4-vinylpyridine, N-methylol acrylamide, dimethylaminopropyl (meth) acrylamide, (meth)acryloyl chloride, (meth)acrylonitrile, styrene sulfonic acid, sodium styrene sulfonate, sulfonic acid derivatives and the like. Two or more functional monomers may also be used in any combination.

Binding of the insulating microparticles to the conductive particles may be performed by physical/mechanical hybridization. In some embodiments, physical/mechanical hybridization includes pressurization, friction and/or high-speed rotation. Apparatuses for implementing the binding of the microparticles may include mills, mechanofusions, hybridizers, theta composers and the like. In some embodiments of the present invention, a hybridizer (for example, the hybridizer manufactured by Nara machine manufacturing Co. Ltd., Japan) is used to bind the insulating microparticles to the conductive particles by mixing the particles in a high-speed air stream in a dry manner and then processing the mixture using physical/chemical energy. The rotational frequency of a rotor, treatment time, mixing ratio and quality of the materials may be varied to affect the binding of the microparticles. Dry hybridization may result in a more uniform surface treatment within a short period of time compared to wet hybridization.

In addition, binding of the microparticles may also be performed by dispersing conductive particles and insulating microparticles in an insoluble solvent by an aggregation process utilizing chemical affinity. However, this process may require relatively long hybridization times and complicated processing steps, including dispersion, aggregation, water washing collection, etc. The insulating microparticles bound using chemical affinity may also separate under a strong shear force when dispersed in an adhesive resin and a solvent. Accordingly, the physical/mechanical hybridization process employed in some embodiments of the present invention may provide greater adhesion and stability because the process can impart both physical adhesion and chemical binding to the insulated conductive particles.

In some embodiments of the present invention, the ratio of the insulating microparticles to the conductive particles in average diameter may be between 0.01:1 and 0.5:1, and in some embodiments, between 0.02:1 and 0.2:1. When the diameter ratio is less than 0.01:1, the distance between adjacent conductive particles may be too small, and thus, electrical insulation may not be achieved. In addition, when the insulated conductive particles with a diameter ratio less than 0.01:1 are interposed between upper and lower electrodes and compressed, the insulating microparticles may not readily transfer and may remain compacted at the compressed sites, thus impeding the electrical connection. However, when the diameter ratio exceeds 0.5:1, binding of the insulating microparticles to the surface of the conductive particles may be difficult, and thus, the desired insulating properties may not be achieved.

While not wishing to be confined to any one mode of action, it is believed that the insulating microparticles move, e.g., slide, along the surface of the conductive metal layer of the conductive particles. This moving may force the insulating microparticles to be transferred/removed by pressurization under connection conditions. When the insulated conductive particles are dispersed and contained in an anisotropic conductive adhesive film, the insulating microparticles present in the pressurizing direction may be transferred/removed upon thermal pressing for circuit connection, achieving electrical connection only in the pressurizing direction (z-axis direction) and maintaining insulation state in the directions (x- and y-axis directions) perpendicular to the pressurization In some embodiments, the insulating microparticles are basically spherical and have a uniform particle diameter distribution. Thus, in some embodiments, insulating microparticles have an aspect ratio of less than about 1.5 and a coefficient of variation (CV) value of about 30% or less.

In some embodiments, the insulating microparticles have an immobilization density of 40% or higher. Further, in some embodiments, the insulating microparticles have an immobilization density of 50% or higher, and in some embodiments, are uniformly distributed on the surface of the conductive particles.

The immobilization density is defined by the following equations 1 and 2:

$$\text{Immobilization density (\%)} = (N/N_{max}) \times 100 \quad (1)$$

$$N_{max} = (2\pi/\sqrt{3})[(D/d)+1]^2 \quad (2)$$

wherein N represents the average number of the insulating microparticles (diameter: d) actually bound to the surface of the conductive particles (diameter: D), and $N_{max}$ represents the number of the microparticles having a smaller diameter that can be maximally packed and regularly arranged to the most extent on the surface of the particles having a larger diameter. When the insulating microparticles have an immobilization density of less than 40%, they may not sufficiently cover the surface of the conductive particle and thus uncovered conductive particles remain in contact with each other, making it difficult to achieve electrical insulation in the xy-plane direction.

In some embodiments of the present invention, an anisotropic adhesive film includes insulated conductive particles according an embodiment of the invention dispersed therein. Thus, in some embodiments, when the adhesive film is pressed, the insulating microparticles present in the pressurizing direction are removed from the surface of the conductive particle upon pressurization, thereby exposing the conductive surface of the conductive particle and achieving electrical connection in the pressurizing direction while maintaining insulation in the direction perpendicular to the pressurizing direction. In some embodiments, the anisotropic adhesive film includes insulated conductive particles of an embodiment of the invention at a weight percent in a range of about 0.1 to about 30%. When the insulated conductive particles 6 are present in an amount of less than 0.1% by weight, the anisotropic conductive adhesive film may not exhibit sufficient electrical connection characteristics. However, when the insulated conductive particles are present in an amount exceeding 30% by weight, electrical insulation reliability between connection circuits may not exist, making it difficult to exhibit anisotropic conductivity.

In some embodiments of the present invention, an electrical connection structure includes an anisotropic adhesive film according to an embodiment of the invention and a pair of substrates facing each other, wherein the anisotropic adhesive film is interposed between the two substrates.

FIG. 1 is a cross-sectional view showing an electrical connection using a conventional anisotropic conductive adhesive film including coated insulated conductive particles. As shown in FIG. 1, a coated insulated conductive particle 1 is composed of a conductive particle 11 and an insulating layer 12 as the outermost layer, and is designed to exhibit anisotropic conductivity upon pressing. However, the insulating layer 12 may not be sufficiently ruptured or removed by pressurization, and may leave a thin film of insulating material, leading to deterioration in electrical connection reliability. Thus, more coated insulated conductive particles may be needed between electrodes to ensure electrical connection reliability. However, as the size of the pitches of interconnection patterns have become smaller, the number of coated insulated conductive particles that can be present may be decreased, essentially leading to the deterioration in electrical connection and electrical insulation reliability.

Figure 2:
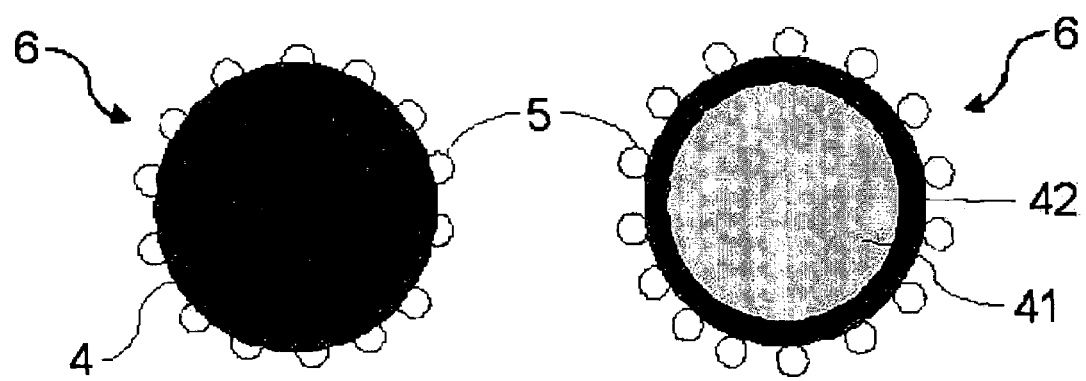
FIG. 2 shows a front view and a cross-sectional view of an insulated conductive particle according to an embodiment of the present invention.

FIG. 2 depicts an insulated conductive particle 6 according to some embodiments of the present invention. The left illustration shows that the insulating microparticles 5 are bound to the surface of the conductive particle 4. The right illustration shows a cross-sectional view of an insulated conductive particle according to an embodiment of the invention, wherein the conductive particle includes a polymer particle 41 coated with a metal layer 42.

Figure 3:
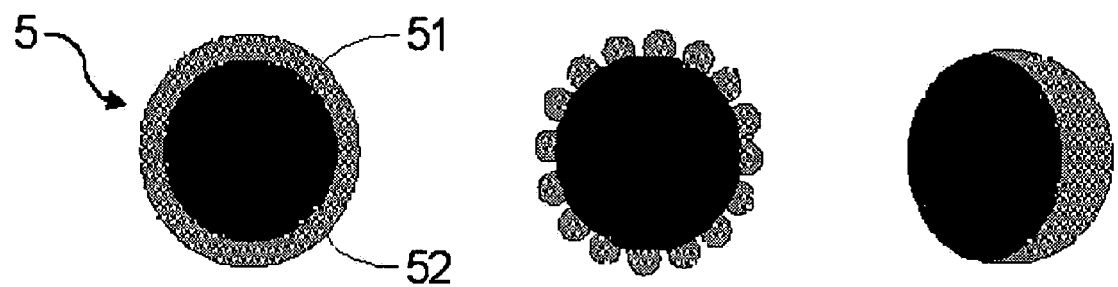
FIG. 3 shows cross-sectional views illustrating various morphologies of insulating microparticles according to some embodiments of the present invention.

FIG. 3 depicts examples of various morphologies of insulating microparticles 5 according to embodiments of the invention. The cross sectional views show that the insulating microparticles 5 may include a hard particle core 51 and a soft functional resin shell 52. The left illustration shows a core-shell morphology, the center illustration shows a raspberry morphology, and the right illustration shows a hemispheric morphology. Other morphologies may also be present. Methods for producing insulating microparticles 5 may include, but are not limited to, emulsion polymerization, surfactant-free emulsion polymerization and seeded polymerization.

Figure 4:
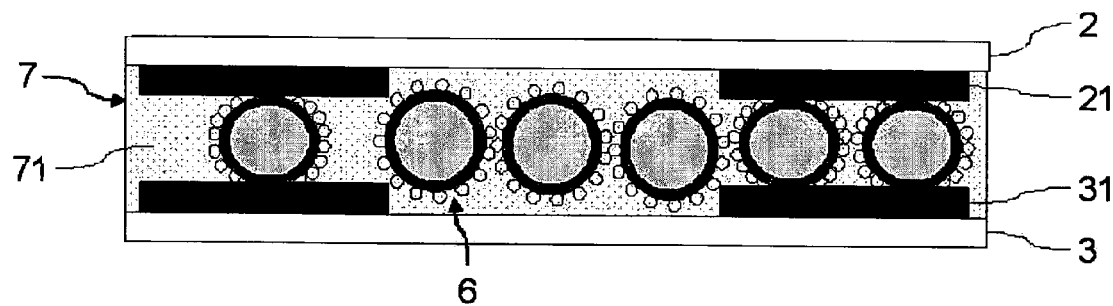
FIG. 4 shows a cross-sectional view of an electrical connection that uses an anisotropic conductive adhesive film including insulated conductive particles of an embodiment of the present invention.

FIG. 4 is a cross-sectional view illustrating an electrical connection structure of an embodiment of the invention. Here, electrically connecting electrodes 21 form interconnection patterns 31 by pressing an anisotropic conductive adhesive film 7 containing insulated conductive particles 6 between substrates 2 and 3. As shown in FIG. 4, the insulated conductive particles 6 of the present invention are dispersed in an insulating adhesive 71. Even after the insulated conductive particles 6 are dispersed in the insulating adhesive 71, the insulating microparticles are bound to the surface of the conductive particles through a physical/chemical binding force, and thus may stably maintain the morphology of the insulated conductive particles and enable maintenance of electrical insulation in the xy-plane direction.

As shown in FIG. 4, the anisotropic conductive adhesive film 7 containing the insulated conductive particles 6 is pressed between a first substrate (e.g., a circuit board) 2, on which electrically connecting electrodes (or bump electrodes) 21 are formed, and a second substrate (e.g., an LCD panel) 3, on which interconnection patterns 31 are formed, to achieve electrical connection between the circuit board 2 and the LCD panel 3. When insulated conductive particles 6 according to an embodiment of the present invention are pressed between the bump electrodes 21 and the interconnection patterns 31, the insulating microparticles bound to the surface of the insulated conductive particles 6 may slide from their initial positions by pressurization. This sliding may force the insulating microparticles to be transferred/removed, and as a result, the bump electrodes 21 and the interconnection patterns 31 may be electrically connected via the conductive particles 4. Accordingly, high electrical connectivity may be attained in the z-axis direction.

As shown in FIG. 4, although the insulated conductive particles 6 may be aggregated to form bridges between adjacent electrodes after the anisotropic conductive adhesive film 7 is pressed between the substrates 2 and 3, electrical contact between the insulated conductive particles 6 may be prevented by the presence of spaces occupied by the insulating microparticles bound to the surface of the conductive particles 4. As a result, since the possibility of shorting between adjacent electrodes is excluded, electrical connection in the xy-plane direction may be prevented and thus high insulation reliability in the xy-plane direction may be achieved.

Figure 5:
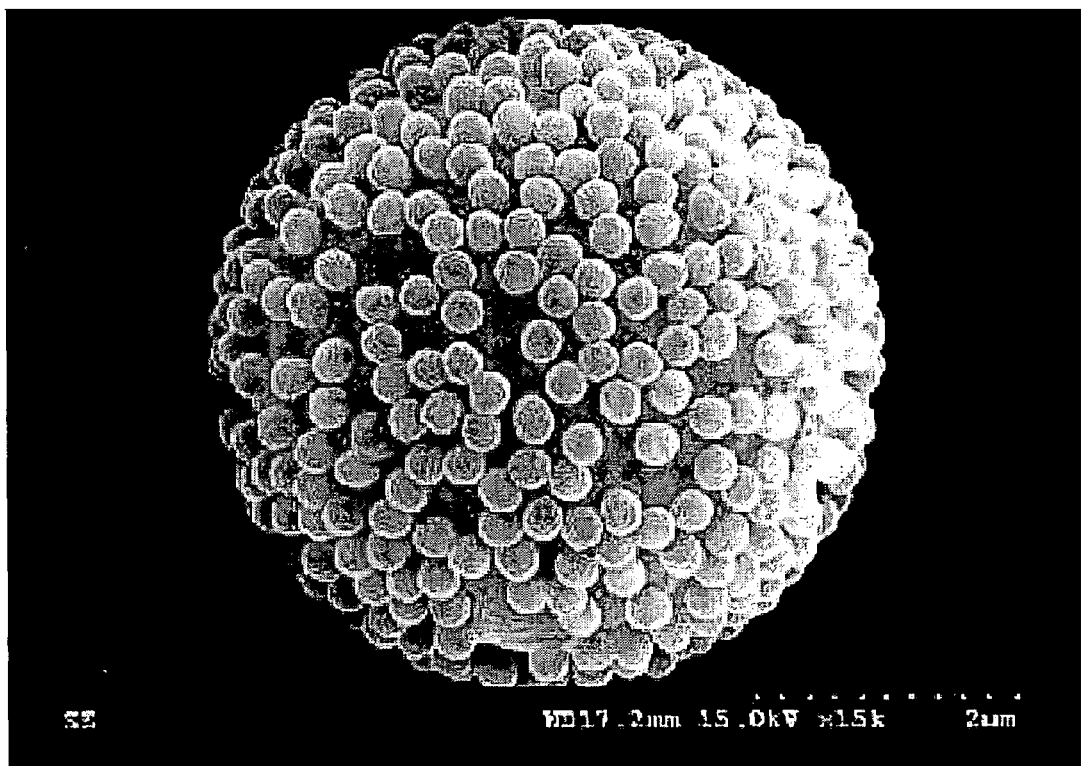
FIG. 5 shows a scanning electron micrograph (SEM) of an insulated conductive particle according to an embodiment of the present invention.

FIG. 5 shows a scanning electron micrograph of an insulated conductive particle of an embodiment of the invention (see Example 2). As shown in FIG. 5, the insulated conductive particles may be uniformly distributed and discretely bound to the surface of the conductive particles while maintaining a spherical shape.

Figure 6:
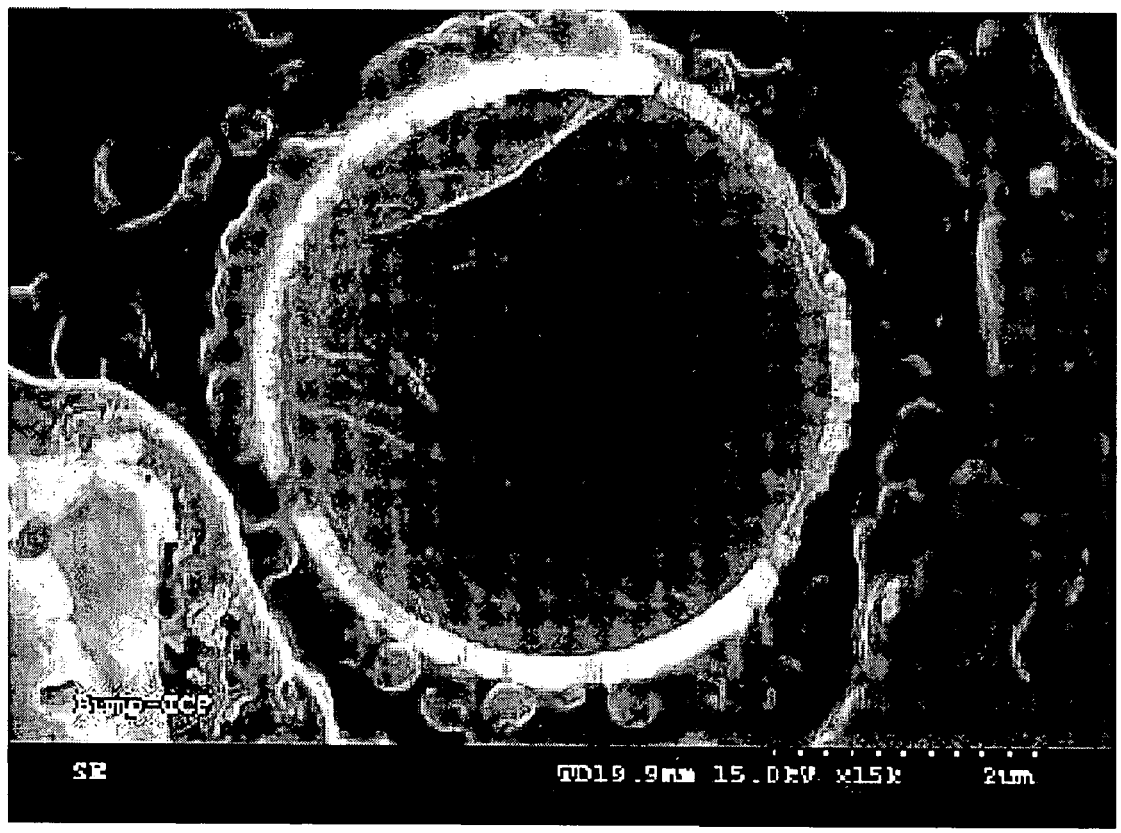
FIG. 6 shows a sectional scanning electron micrograph (SEM) of an anisotropic conductive adhesive film in which insulated conductive particles of an embodiment of the present invention are dispersed.

FIG. 6 shows a sectional scanning electron micrograph of an anisotropic conductive adhesive film in which insulated conductive particles according to an embodiment of the present invention are dispersed. As is evident from FIG. 6, the conductive particles are uniformly surrounded by spherical insulating microparticles. This demonstrates that the insulating microparticles may be stably bound to the surface of the conductive particles when the insulated conductive particles are dispersed in the insulating adhesive resin. Accordingly, although the insulated conductive particles of the present invention may be adjacent to each other and aggregated, the bound insulating microparticles may prevent direct contact between metal layers, thus impeding electrical connection and preventing the occurrence of shorting therebetween.

Figure 7:
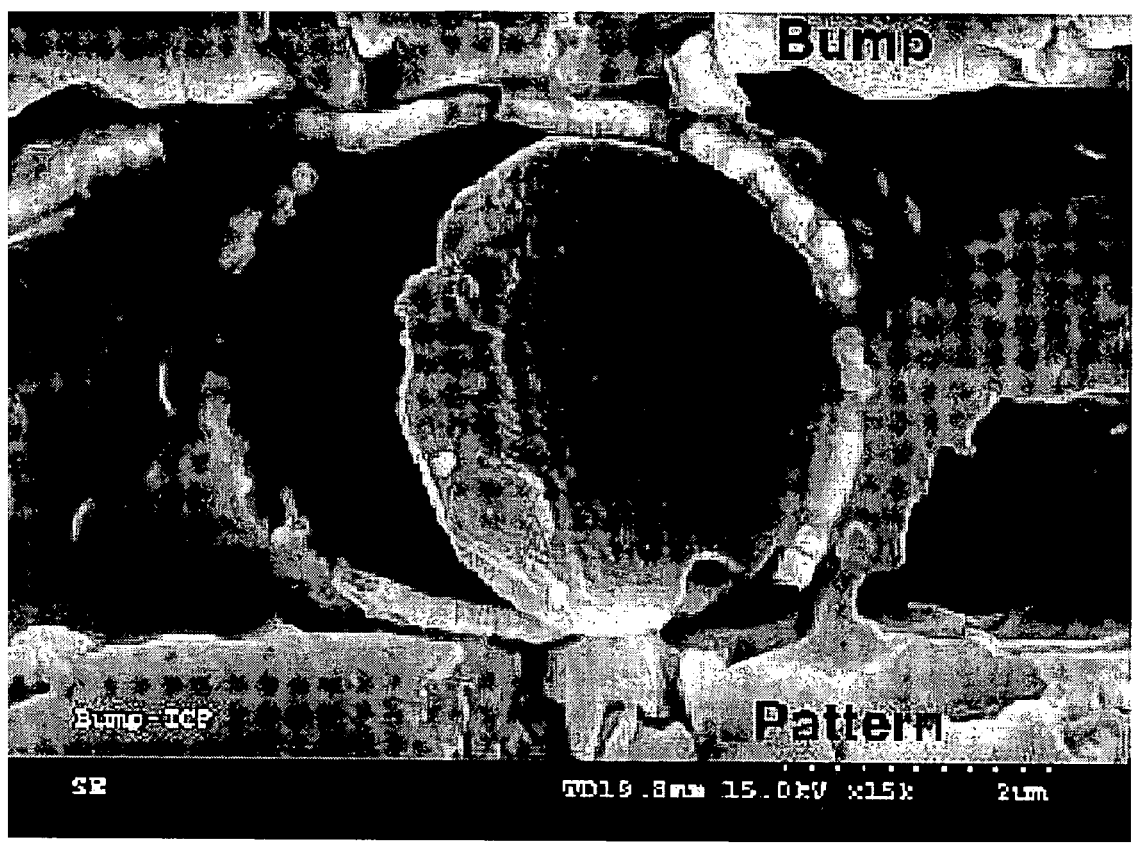
FIG. 7 shows a scanning electron micrograph (SEM) of a cross section of an electrical connection structure manufactured by interposing an anisotropic conductive adhesive film including insulated conductive particles of an embodiment of the invention between upper and lower electrodes, followed by compression.

FIG. 7 shows a scanning electron micrograph (SEM) of a cross section of an electrical connection structure manufactured by interposing an anisotropic conductive adhesive film including insulated conductive particles of an embodiment of the invention between upper and lower electrodes, followed by compression. As is evident in FIG. 7, the insulated conductive particles interposed between the electrodes may be deformed by compression, and the insulating microparticles bound to the insulated conductive particles may be separated and removed from the contact surface with the electrodes to expose the conductive metal layer and to come into contact with the electrodes. However, since the insulating microparticles remain bound to the surface of the conductive particles in the left and right plane directions perpendicular to the upper and lower compression directions, the electrical insulation may be maintained in the left and right plane directions.

EXAMPLES

Example 1

(1) Production of Insulating Microparticles

First, deionized water and sodium lauryl sulfate (SLS, emulsifying agent) were weighed and introduced into a reactor. The mixture was stirred in a nitrogen atmosphere at 70° C.

for 30 minutes. Styrene and divinyl benzene were added to the mixture at a weight ratio of 50:50, and stirred for 10 minutes. Thereafter, an aqueous potassium persulfate (KPS, initiator) solution was added, followed by emulsion polymerization at 300 rpm and 70° C. for 10 hours, to obtain a hard particle region. Subsequently, a small amount of an aqueous potassium persulfate (KPS) solution was added to the hard particle region, and then styrene, acrylic acid and divinyl benzene were added thereto at a weight ratio of 75:20:5. Polymerization then occurred (under the same conditions as the previous polymerization) for 10 hours to introduce a soft functional resin region. The insulating microparticles thus produced had a core-shell structure consisting of the hard particle region and the soft functional resin region. The insulating microparticles were washed with deionized water several times and lyophilized. Light scattering analysis indicated that the insulating microparticles had an average diameter of 0.20 µm.

(2) Production of Insulated Conductive Particles

First, a Ni/Au alloy was plated on monodisperse organic polymer particles to prepare conductive particles having an average diameter of 4 µm. The insulating microparticles produced in (1) were bound to the surface of the conductive particles using a hybridizer (NHS-0). The insulation was performed using the hybridizer at a high rotational speed of 9,000 rpm for 10 minutes. The surface immobilization density of the insulating microparticles bound to the surface of the conductive particles was obtained by scanning electron micrography (SEM). As a result, the surface immobilization density was measured to be 84%.

(3) Production of Anisotropic Conductive Adhesive Film 25 parts by weight of a urethane acrylate-based radical-polymerizable material, 25 parts by weight of an epoxy resin, 15 parts by weight of a radical-polymerizable material having an epoxy functional group, 20 parts by weight of an elastomer, 4 parts by weight of a radical curing agent, 4 parts by weight of a solid-state epoxy curing agent, 1 part by weight of a silane coupler and 6 parts by weight of the insulated conductive particles were mixed in 100 parts by weight of toluene to prepare a resin solution. The resin solution was applied to a white release film, evaporated to remove the solvent, and dried to obtain an anisotropic conductive adhesive film having a thickness of 20 µm.

Example 2

Insulating microparticles having a particle diameter of 0.35 µm were produced and insulated conductive particles were produced using the insulating microparticles in accordance with the procedure in Example 1. The insulated conductive particles were measured to have an immobilization density of 81%. An anisotropic conductive adhesive film was formed using the insulated conductive particles in accordance with the procedure in Example 1.

FIG. 5 shows a scanning electron micrograph of an insulated conductive particle produced in Example 2. As shown in FIG. 5, the insulated conductive particles are uniformly distributed and discretely bound to the surface of the conductive particles while maintaining the spherical shape.

Example 3

Insulating microparticles having a particle diameter of 0.48 µm were produced and insulated conductive particles were produced using the insulating microparticles in accordance with the procedure in Example 1. The insulated conductive particles were measured to have an immobilization density of 72%. An anisotropic conductive adhesive film was formed using the insulated conductive particles in accordance with the procedure in Example 1.

Example 4

Insulating microparticles having a particle diameter of 0.35 µm were produced and insulated conductive particles were produced using the insulating microparticles in accordance with the procedure in Example 1. The insulated conductive particles were measured to have an immobilization density of 60%. An anisotropic conductive adhesive film was formed using the insulated conductive particles in accordance with the procedure in Example 1.

Comparative Example 1

Insulating microparticles with a particle diameter of 0.35 µm containing no functional group were produced in the same manner as in Example 1, except that a monomeric mixture of styrene and divinyl benzene (95:5 w/w) was used instead of the monomeric mixture of styrene, acrylic acid and divinyl benzene to form a soft functional resin region. Insulated conductive particles were produced using the insulating microparticles in accordance with the procedure in Example 1. The insulated conductive particles were measured to have an immobilization density of 80%. An anisotropic conductive adhesive film was formed using the insulated conductive particles in accordance with the procedure in Example 1.

Comparative Example 2

Insulated conductive particles were produced in the same manner as in Example 1, except that silica particles having an average diameter of 0.3 µm were used as insulating microparticles. The insulated conductive particles were measured to have an immobilization density of 75%. An anisotropic conductive adhesive film was formed using the insulated conductive particles in accordance with the procedure in Example 1.

Comparative Example 3

Coated insulated conductive particles were produced in the same manner as in Example 1, except that crosslinked polymethylmethacrylate resin particles (Eposta, Japan catalyst Co. Ltd.) having an average diameter of 0.25 µm were used as the insulating microparticles and the hybridizer was operated at 16,000 rpm during physical/mechanical hybridization. The entire surface of the conductive particles was covered with the insulating resin. An anisotropic conductive adhesive film was formed using the coat-insulated conductive particles in accordance with the same procedure as in Example 1.

Evaluation of Physical Properties of the Prepared Insulated Conductive Particles and Anisotropic Conductive Adhesive Films A highly viscous solvent mixture having a similar viscosity to the resin composition for producing the anisotropic conductive adhesive films was used to evaluate the chemical resistance of the insulated conductive particles produced in Examples 1-4 and Comparative Examples 1-3. First, each of the insulated conductive particles was quantified and dispersed in the solvent mixture containing 30% by weight of a nitrile-butadiene rubber (NBR) in toluene. After the dispersion was stirred for five hours, the insulated conductive particles were collected and dried. The chemical resistance of the insulated conductive particles was evaluated by measuring the ratio of the weight of the particles before the solvent treatment to the weight of the particles after the solvent treatment. The obtained results are shown in Table 1.

The physical properties of the anisotropic conductive adhesive films produced in Examples 1-4 and Comparative Examples 1-3 were evaluated in accordance with the following procedure. First, each of the films was allowed to stand in a desiccator under drying conditions at room temperature (25° C.) for one hour. The film was interposed between an ITO-patterned glass substrate (lead width: 30 μm, pitch: 65 μm, thickness: 5,000 Å) and a chip on film (COF) (lead width: 25 μm, pitch: 65 μm, thickness: 9 μm) having a gold-plated copper circuit, and then pressurized to 3 MPa while heating to 180° C. for 6 seconds to manufacture an electrical connection structure.

Electrical resistance values between 20 adjacent upper and lower electrodes for each of the connection samples were measured and averaged. The results are shown in Table 1. Further, the connection reliability of the connection structures was evaluated through a reliability test under high-temperature and high-humidity conditions and a test under thermal impact. The obtained results are shown in Table 1. The former test was conducted by aging the connection sample at a temperature of 80° C. and a relative humidity of 85% for 1,000 hours, and measuring any incremental change in resistance. The latter test was conducted by performing 500 thermal impact cycles and measuring the incremental change in resistance. In the tests, connection reliability was evaluated based on the following criteria:

□ (excellent): Increment in resistance≦1Ω
Δ (good): 1Ω<Increment in resistance≦1.5Ω
X (poor): 1.5 Ω<Increment in resistance Further, the insulation reliability of each of the films was evaluated in the following dimensions: Size of bumps, 35 μm×75 μm; Height of bumps, 20 μm; IC chip size, 6 mm×6 mm. For the transparent glass substrate on which transparent conductive electrodes (indium tin oxide) were formed as interconnection patterns: Pitch, 65 μm; and Line, 70 μm. The results are shown in Table 1. The transparent substrate was used to observe the occurrence of shorting by a microscope.

surface of the conductive particles, exhibit superior chemical resistance, electrical connection characteristics, connection reliability and insulation reliability when compared to the anisotropic conductive adhesive films including insulated conductive particles (Comparative Examples 1 and 2) produced by simple physical immobilization of the insulated particles or coat-insulation of the conductive particles (Comparative Example 3).

Those skilled in the art will readily recognize and appreciate that many modifications and variations can be made and such modifications and variations are encompassed within the scope and spirit of the present invention.

The invention claimed is:

1. An insulated conductive particle, comprising
a conductive particle with insulating microparticles chemically bound thereto,
wherein the insulating microparticles comprise a hard particle region and a soft functional resin region, and
wherein the soft functional resin region comprises a functional group that is chemically bound to the conductive particle.

2. The insulated conductive particle of claim 1, wherein the conductive particle comprises a conductive metal layer coated on the surface of a polymer particle.

3. The insulated conductive particle of claim 2, wherein the conductive particle has an average diameter of about 1 to about 20 μm, an aspect ratio of less than about 1.5 and a coefficient of variation (CV) value of about 20% or less.

4. The insulated conductive particle of claim 2, wherein the conductive metal layer has a thickness in a range of about 0.1 μm to about 1 μm.

5. The insulated conductive particle of claim 1, wherein the insulating microparticles have a core-shell structure, with the hard particle region comprising the core and the soft functional resin region comprising the shell.

6. The insulated conductive particle of claim 1, wherein the hard particle region comprises a particle selected from the group consisting of an inorganic particle; a crosslinked organic polymer particle formed from 30% by weight or more, based on the total weight of the monomers, of a crosslinking monomer; and an organic/inorganic hybrid particle.

7. The insulated conductive particle of claim 6, wherein the hard particle region comprises an inorganic particle selected

TABLE 1

| | | Examples | | | | Comparative Examples | | |
|---|---|---|---|---|---|---|---|---|
| | | Example No. | | | | | | |
| | | 1 | 2 | 3 | 4 | 1 | 2 | 3 |
| Insulated conductive particles | Diameter of insulated particles [μm] | 0.20 | 0.35 | 0.48 | 0.35 | 0.35 | 0.30 | 0.25 |
| | Immobilization density [%] | 84 | 81 | 72 | 60 | 80 | 75 | (coated) |
| | Chemical resistance [%] | 96 | 94 | 90 | 91 | 58 | 15 | 98 |
| Anisotropic conductive adhesive film | Connection resistance [Ω] | 0.9 | 0.7 | 0.6 | 0.6 | 0.7 | 0.8 | 1.3 |
| | Connection reliability | Δ | □ | □ | □ | □ | Δ | X |
| | Insulation reliability | □ | □ | □ | Δ | X | X | □ |

As can be seen from the data shown in Table 1 (Examples 1-4 and Comparative Examples 1-3), the anisotropic conductive adhesive films containing the insulated conductive particles, in which the insulating microparticles having a double structure including a hard particle region and a soft functional resin region and were physically/chemically bound to the from the group consisting of a silica particle, a titanium dioxide particle and a metal oxide particle.

8. The insulated conductive particle of claim 6, wherein the hard particle region comprises a crosslinked organic polymer particle comprising a homopolymer or copolymer of one or more crosslinking monomers.

9. The insulated conductive particle of claim 8, wherein the crosslinking monomer is polymerized by radical polymerization.

10. The insulated conductive particle of claim 8, wherein the crosslinking monomer is selected from the group consisting of a polyacrylate monomer, a polyallyl monomer, a polyvinyl monomer and any combination thereof.

11. The insulated conductive particle of claim 10, wherein the crosslinking monomer is a polyacrylate monomer selected from the group consisting of poly(ethylene glycol) diacrylate, poly(ethylene glycol) dimethacrylate, poly(propylene glycol) diacrylate, poly(propylene glycol) dimethacrylate, pentaerythritol tetraacrylate, pentaerythritol tetramethacrylate, pentaerythritol triacrylate, pentaerythritol trimethacrylate, pentaerythritol diacrylate, pentaerythritol dimethacrylate, trimethylolpropane triacrylate, trimethylolpropane trimethacrylate, dipentaerythritol hexaacrylate, dipentaerythritol hexamethacrylate, dipentaerythritol pentaacrylate, dipentaerythritol pentamethacrylate, glycerol triacrylate, glycerol trimethacrylate and any combination thereof.

12. The insulated conductive particle of claim 10, wherein the crosslinking monomer is a polyallyl monomer selected from the group consisting of diallyl phthalate, diallylacrylamide, triallyl (iso)cyanurate, triallyl mellitate and any combination thereof.

13. The insulated conductive particle of claim 10, wherein the crosslinking monomer is a polyvinyl monomer selected from the group consisting of divinylbenzene, 1,4-divinyloxybutane, divinylsulfone and any combination thereof.

14. The insulated conductive particle of claim 6, wherein the hard particle region comprises a crosslinked organic polymer particle comprising a copolymer of at least one crosslinking monomer and at least one non-crosslinking monomer.

15. The insulated conductive particle of claim 14, wherein the crosslinking monomer and the non-crosslinking monomer are polymerized by radical polymerization.

16. The insulated conductive particle of claim 14, wherein the crosslinking monomer is selected from the group consisting of a polyacrylate monomer, a polyallyl monomer, a polyvinyl monomer and any combination thereof.

17. The insulated conductive particle of claim 16, wherein the crosslinking monomer is a polyacrylate monomer selected from the group consisting of poly(ethylene glycol) diacrylate, poly(ethylene glycol) dimethacrylate, poly(propylene glycol) diacrylate, poly(propylene glycol) dimethacrylate, pentaerythritol tetraacrylate, pentaerythritol tetramethacrylate, pentaerythritol triacrylate, pentaerythritol trimethacrylate, pentaerythritol diacrylate, pentaerythritol dimethacrylate, trimethylolpropane triacrylate, trimethylolpropane trimethacrylate, dipentaerythritol hexaacrylate, dipentaerythritol hexamethacrylate, dipentaerythritol pentaacrylate, dipentaerythritol pentamethacrylate, glycerol triacrylate, glycerol trimethacrylate and any combination thereof.

18. The insulated conductive particle of claim 16, wherein the crosslinking monomer is a polyallyl monomer selected from the group consisting of diallyl phthalate, diallylacrylamide, triallyl(iso)cyanurate, triallyl mellitate and any combination thereof.

19. The insulated conductive particle of claim 16, wherein the crosslinking monomer is a polyvinyl monomer selected from the group consisting of divinylbenzene, 1,4-divinyloxybutane, divinylsulfone and any combination thereof.

20. The insulated conductive particle of claim 14, wherein the non-crosslinking monomer is selected from the group consisting of an monoacrylate monomer, a vinyl monomer and any combination thereof.

21. The insulated conductive particle of claim 20, wherein the non-crosslinking monomer is an acrylate selected from the group consisting of methyl acrylate, methyl methacrylate, ethyl acrylate, ethyl methacrylate, propyl acrylate, propyl methacrylate, n-butyl acrylate, n-butyl methacrylate, isobutyl acrylate, isobutyl methacrylate, t-butyl acrylate, t-butyl methacrylate, 2-ethyl hexyl acrylate, 2-ethyl hexyl methacrylate, n-octyl acrylate, n-octyl methacrylate, lauryl acrylate, lauryl methacrylate, stearyl acrylate, stearyl methacrylate and any combination thereof.

22. The insulated conductive particle of claim 20, wherein the non-crosslinking monomer is a vinyl monomer selected from the group consisting of styrene, a-methyl styrene, m-chloromethyl styrene, ethylvinyl benzene, vinylchloride, vinyl acetate, vinyl ether, vinyl proprionate, vinyl butyrate and any combination thereof.

23. The insulated conductive particle of claim 1, wherein the soft functional resin region comprises a linear organic polymer resin comprising a functional group that is chemically bound to the conductive particle.

24. The insulated conductive particle of claim 23, wherein the functional group is selected from the group consisting of carboxyl, hydroxyl, glycol, aldehyde, oxazoline, silane, silanol, amine, ammonium, amide, imide, nitro, nitrile, pyrrolidone, thiol, sulfonic acid, sulfonium, sulfide and isocyanate groups.

25. The insulated conductive particle of claim 23, further comprising a functional monomer.

26. The insulated conductive particle of claim 25, wherein the functional monomer is selected from the group consisting of acrylic acid, methacrylic acid, maleic acid, itaconic acid, 2-hydoxyethyl acrylate, 2-hydoxyethyl methacrylate, hydroxypropyl acrylate, hydroxypropyl methacrylate, hydroxybutyl acrylate, hydroxybutyl methacrylate, polyethylene glycol acrylate, polyethylene glycol methacrylate, methoxypolyethylene glycol acrylate, methoxypolyethylene glycol methacrylate, glycidyl acrylate, glycidyl methacrylate, dimethylaminoethyl acrylate, dimethylaminoethyl methacrylate, allyl glycidyl ether, 2-isopropenyl-2-oxazoline, diethylaminoethyl acrylate, diethylaminoethyl methacrylate, alkylacrylamide, alkylmethacrylamide, 4-vinylpyridine, N-methylol acrylamide, dimethylaminopropyl acrylamide, dimethylaminopropyl methacrylamide, acryloyl chloride, methacryloyl chloride, acrylonitrile, methacrylonitrile, styrene sulfonic acid, sodium styrene sulfonate, sulfonic acid derivatives and any combination thereof.

27. The insulated conductive particle of claim 1, wherein the soft functional resin region comprises a non-crosslinking monomer and crosslinking monomer, wherein the crosslinking monomer is present in an amount in a range of about 0.5% to about 15% by weight, based on the total weight of the monomers.

28. The insulated conductive particle of claim 27, wherein the functional group is selected from the group consisting of carboxyl, hydroxyl, glycol, aldehyde, oxazoline, silane, silanol, amine, ammonium, amide, imide, nitro, nitrile, pyrrolidone, thiol, sulfonic acid, sulfonium, sulfide and isocyanate groups.

29. The insulated conductive particle of claim 27, further comprising a functional monomer.

30. The insulated conductive particle of claim 29, wherein the functional monomer is selected from the group consisting of acrylic acid, methacrylic acid, maleic acid, itaconic acid, 2-hydoxyethyl acrylate, 2-hydoxyethyl methacrylate, hydroxypropyl acrylate, hydroxypropyl methacrylate, hydroxybutyl acrylate, hydroxybutyl methacrylate, polyethylene glycol acrylate, polyethylene glycol methacrylate, methoxypolyethylene glycol acrylate, methoxypolyethyl ene glycol methacrylate, glycidyl acrylate, glycidyl methacrylate, dimethylaminoethyl acrylate, dimethylaminoethyl methacrylate, allyl glycidyl ether, 2-isopropenyl-2-oxazoline, diethylaminoethyl acrylate, diethylaminoethyl methacrylate, alkylacrylamide, alkylmethacrylamide, 4-vinylpyridine, N-methylol acrylamide, dimethylaminopropyl acrylamide, dimethylaminopropyl methacrylamide, acryloyl chloride, methacryloyl chloride, acrylonitrile, methacrylonitrile, styrene sulfonic acid, sodium styrene sulfonate, sulfonic acid derivatives and any combination thereof.

31. The insulated conductive particle of claim 1, wherein the insulating microparticles are chemically bound to the conductive particle by physical/mechanical hybridization.

32. The insulated conductive particle of claim 1, wherein the insulating microparticles have an aspect ratio of less than about 1.5 and a CV value of about 30% or less.

33. The insulated conductive particle of claim 1, wherein the insulating microparticles have an immobilization density of about 40% or more.

34. The insulated conductive particle of claim 1, wherein the ratio of the average diameter of the insulating microparticles to the average diameter of the conductive particle is in a range of about 0.01:1 to about 0.5:1.

35. An anisotropic adhesive film comprising
an insulated conductive particle, comprising a conductive particle with insulating microparticles chemically bound thereto, wherein the insulating microparticles comprise a hard particle region and a soft functional resin region, and wherein the soft functional resin region comprises a functional group that is chemically bound to the conductive particle; and
wherein when the adhesive film is pressed, the insulating microparticles that are present in the pressurizing direction are removed from the surface of the conductive particle, thereby exposing the conductive surface of the conductive particle and achieving electrical connection in the pressurizing direction while maintaining insulation in the direction perpendicular to the pressurizing direction.

36. The anisotropic adhesive film of claim 35, wherein the insulated conductive particle is present in the film at a weight percent in a range of about 0.1 to about 30%.

37. An electrical connection structure comprising the anisotropic adhesive film of claim 35 interposed between a pair of substrates facing each other.

* * * * *

UNITED STATES PATENT AND TRADEMARK OFFICE
CERTIFICATE OF CORRECTION

PATENT NO. : 7,566,494 B2  Page 1 of 1
APPLICATION NO. : 11/325813
DATED : July 28, 2009
INVENTOR(S) : Jun et al.

It is certified that error appears in the above-identified patent and that said Letters Patent is hereby corrected as shown below:

In the Claims:

Column 15, Claim 9, Line 8: Please correct "crossliriking" to read -- crosslinking --.

Signed and Sealed this

Twenty-second Day of December, 2009

David J. Kappos
*Director of the United States Patent and Trademark Office*